United States Patent
Johnson et al.

(10) Patent No.: US 7,110,427 B2
(45) Date of Patent: *Sep. 19, 2006

(54) HYBRID MIRROR VCSEL

(75) Inventors: Ralph H. Johnson, Murphy, TX (US); Tzu-Yu Wang, Maple Grove, MN (US)

(73) Assignee: Finisar Corporation, Sunnyvale, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 10/933,876

(22) Filed: Sep. 3, 2004

(65) Prior Publication Data

US 2005/0047474 A1    Mar. 3, 2005

Related U.S. Application Data

(63) Continuation of application No. 10/233,112, filed on Sep. 3, 2002, now Pat. No. 6,798,806.

(51) Int. Cl.
*H01S 3/04* (2006.01)
(52) U.S. Cl. ..................... 372/43.01; 372/99
(58) Field of Classification Search ............ 372/43.01, 372/46.01, 96, 99
See application file for complete search history.

(56) References Cited

U.S. PATENT DOCUMENTS

| | | | |
|---|---|---|---|
| 5,574,738 A * | 11/1996 | Morgan | 372/28 |
| 5,745,515 A * | 4/1998 | Marta et al. | 372/45.013 |
| 5,864,575 A * | 1/1999 | Ohiso et al. | 372/96 |
| 6,798,806 B1 * | 9/2004 | Johnson et al. | 372/43.01 |

* cited by examiner

*Primary Examiner*—Hoang V. Nguyen
*Assistant Examiner*—Leith A. Al-Nazer
(74) *Attorney, Agent, or Firm*—Workman Nydegger

(57) ABSTRACT

The invention is generally concerned with vertical cavity surface emitting lasers. In one example, the vertical cavity surface emitting laser includes, among other things, an upper mirror structure having a metal contact, a top mirror above the metal contact, and a semiconductive top DBR having an insulation region, wherein the top DBR is no more than 3.5 microns thick and is disposed below the metal contact. Thus, the top DBR is sufficiently thick as to enable adequate current spreading, but thin enough to enable fabrication of an isolation region using relatively low energy ion implantation or relatively shallow etching.

27 Claims, 3 Drawing Sheets

HYBRID MIRROR VCSEL

RELATED APPLICATIONS

This application is a continuation, and claims the benefit, of U.S. patent application Ser. No. 10/233,112, filed Sep. 3, 2002 now U.S. Pat. No. 6,798,806, and entitled "Hybrid Mirror VCSELs," which is incorporated herein in its entirety by this reference.

BACKGROUND OF THE INVENTION

1. The Field of the Invention

In general, the invention relates to vertical cavity surface emitting lasers (VCSELs). More specifically, exemplary embodiments of the invention are directed to VCSELs capable of long wavelength emissions.

2. Related Technology

VCSELs represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the material systems can be tailored to produce laser wavelengths such as 1550 nm, 1310 nm, 850 nm, 780 nm, 670 nn, and so on.

VCSELs include semiconductor active regions, distributed Bragg reflector (DBR) mirrors, current confinement structures, substrates, and electrical contacts. Because of their complicated structure and material requirements, VCSELs are usually fabricated using metal-organic chemical vapor deposition (MOCVD) or molecular beam epitaxy (MBE).

FIG. 1 illustrates a typical VCSEL 10. As shown, a substrate 12 has an n-type electrical contact 14. An n-doped lower mirror stack 16 (a DBR) is on the substrate 12, and an n-doped graded-index lower spacer 18 (a confinement layer) is disposed over the lower mirror stack 16. An active region 20, beneficially having a number of quantum wells, is formed over the lower spacer 18. A p-doped graded-index top spacer 22 (another confinement layer) is disposed over the active region 20, and a p-doped top mirror stack 24 (another DBR) is disposed over the top spacer 22. Over the top mirror stack 24 is a p-doped conduction layer 9, a p-doped cap layer 8, and a p-doped electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonate at a predetermined wavelength (or at a multiple thereof). At least part of the top mirror stack 24 includes an insulating region 40 that provides current confinement. The insulating region 40 is usually formed either by implanting protons into the top mirror stack 24 or by an oxide layer. The insulating region 40 defines a conductive annular central aperture 42 that forms an electrically conductive path though the insulating region 40.

In operation, an external bias causes an electrical current 21 to flow from the p-doped electrical contact 26 toward the n-doped electrical contact 14. The insulating region 40 and the conductive central aperture 42 confine the current 21 such that the current flows through the conductive central aperture 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-doped conduction layer 9, through the p-doped cap layer 8, through an aperture 30 in the p-doped electrical contact 26, and out of the surface of the VCSEL 10.

It should be understood that FIG. 1 illustrates a typical VCSEL, and that numerous variations are possible. For example, the dopings can be changed (say, by providing a p-doped substrate 12), a wide range of material systems can be used, operational details can be tuned for maximum performance, and additional structures, such as tunnel junctions, can be added. However, the VCSEL 10 beneficially illustrates a useful, common, and exemplary VCSEL configuration. Therefore, the fabrication of the VCSEL 10 will be described in more detail.

The substrate 12 effectively controls the bottom DBR and the active region. This is because overall lattice matching is extremely important since the active region 20 is intolerant of lattice defects. In practice, a semiconductor epitaxy is formed on the substrate 12 to improve lattice matching. The particular semiconductor epitaxy used is wavelength and device dependent. For 1310 nm emissions from GaAs substrates the semiconductor epitaxy is usually AlGaAs and/or InGaAsN and/or InGaAsNSb of varying compositions. For 1550 nm emissions from InP substrates the semiconductor epitaxy is usually AlGaAsSb and/or AlGaInAs and/or InGaAsP and/or InP. For 1550 nm emissions from GaAs, the semiconductor epitaxy is usually AlGaAs and/or InGaAsNSb.

With the substrate 12 and the semiconductor epitaxy in place, the lower mirror stack 16 is fabricated. For 1310 nm or 1550 nm emissions from GaAs substrates 12 the lower mirror stack 16 is beneficially comprised of alternating compositions of $Al(x)Ga(1-x)As$ that produce high and low index layers. For emissions at 1550 nm from InP substrates 12 the lower mirror stack 16 is beneficially comprised of alternating compositions of InGaAsP/InP, of AlGaInAs/InP, of AlGaAsSb/InP, or of AlGaPSb/InP. The compositional and doping grades of the layers should be selected to improve electrical properties (such as series resistance).

After the lower mirror stack 16 is grown, the lower spacer 18, the active region 20, and the top spacer 22 are fabricated. The lower spacer 18 and the top spacer 22 are beneficially comprised of low-doped layers having compositional grades. The active region 20 beneficially includes a plurality of quantum wells (say 3 to 9) that are sandwiched between higher bandgap energy semiconductor barrier layers.

The top mirror stack 24 having the insulating region 40 having the conductive central aperture 42 is then fabricated over the top spacer 22. The top mirror 24 is beneficially formed (described in more detail subsequently) from similar layers as the lower mirror stack 16. Then, the p-doped conduction layer 9, the p-doped cap layer 8 having the aperture 30, and the p-doped electrical contact 26 are fabricated.

Still referring to the fabrication of the top mirror stack 24, if an oxide layer is used to form the insulating region 40 the top mirror stack 24 includes a high aluminum content layer that is bounded by lower Al content layers. A trench is then formed to the high aluminum content layer. The high aluminum content layer is then oxidized via the trench to produce the insulating region 40. Alternatively, if ion implantation is used to form the insulating region 40, then such ions are implanted into the top mirror stack 24. The incoming ions damage the top mirror structure so as to form the insulating region 40. In either event the top mirror stack 24 must be thick enough for adequate current spreading. Ion-implanted VCSELs have demonstrated greater reliability than those that use oxidized layers, but oxide VCSELs have advantages of higher speed and higher efficiency.

While generally successful, VCSELs are not without problems. In particular, VCSELs used at long wavelengths, such as 1550 run or 1310 run, are currently significantly less than optimal. However, long-wavelength VCSELs (1.3 µm–1.6 µm) are well suited for next generation data communication and telecommunication applications.

A major problem with long wavelength VCSELs is fabricating their top mirror stacks 24. This is partially because the refractive index contrasts of the materials used in the top mirror stacks 24 are relatively small, which means that the top mirror stacks 24 must have many contrasting layers. This makes the top mirror stacks 24 relatively thick. Compounding the thickness problem is that long wavelength operation makes otherwise comparable structures thicker simply because of the longer wavelengths. Thus, long-wavelength VCSELs tend to have very thick top mirror stacks 24. But, thick mirror stacks are difficult to ion implant protons (such as is required when forming ion implanted insulating regions 40) and are difficult to etch, as is common when producing trenches for oxide VCSELs. Thus, long wavelength VCSELs require higher energy, are more expensive, are more difficult to implant, and have longer etching cycles.

Compounding the fabrication problem are VCSEL arrays. While FIG. 1 shows an individual VCSEL, in many applications multiple VCSELs are fabricated on a single substrate simultaneously. It is then necessary to isolate the individual VCSEL elements. This is usually performed either by etching trenches or by ion implanting through the active region 20. Again, a thicker top mirror stack 24 and a thicker top spacer 18 and active region 20 are required for longer wavelengths. Thus, isolating individual VCSEL elements is difficult.

In view of the foregoing, novel long-wavelength VCSELs would be beneficial. Even more beneficial would be long-wavelength VCSELs having thinner top DBR mirror structures.

BRIEF SUMMARY OF AN EXEMPLARY EMBODIMENT OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to novel VCSELs that are suitable for use at long-wavelengths. Such novel VCSELs have thinner top DBR mirrors, which enables easier trench etching and/or ion implantation. Beneficially, such VCSELs are implemented using common fabrication technology.

A VCSEL according to the principles of the present invention includes an upper mirror structure that includes a semiconductive top DBR, metal contacts, and an additional top mirror. The top DBR is sufficiently thick as to enable adequate current spreading, but thin enough to enable fabrication of an isolation region using relatively low energy ion implantation or relatively shallow etching. In particular, the top DBR is no more than 3.5 microns thick. The additional top mirror, which is over the top DBR, is beneficially comprised of a dielectric or an amorphous semiconductor material, such as $TiO_2$; $TiO_2+SiO_2$ (which is both robust and reliable); $TiO_2+Al_2O_3$ (which has good thermal conductivity); or $Si+MgO$, or $Si_3N_4+SiO_2$, or of a metal. The top mirror enhances the reflectivity of the top DBR. The additional top mirror is beneficially formed using a vacuum deposition method, such as e-beam or sputtering. In practice, depositing a metallic ring on the top DBR forms the metal contacts.

A VCSEL according to the principles of the present invention further includes a substrate with an electrical contact. A bottom DBR (made from stacked material layers having different indexes of refraction) is over a substrate, and a bottom spacer is over the bottom DBR. An active region is disposed over the bottom spacer, and a top spacer is over the active region. The upper mirror structure is disposed over the active region or the top spacer.

Additional features and advantages of the invention will be set forth in the description that follows, and in part will be apparent from that description, or may be learned by practice of the invention.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

Figure 1:
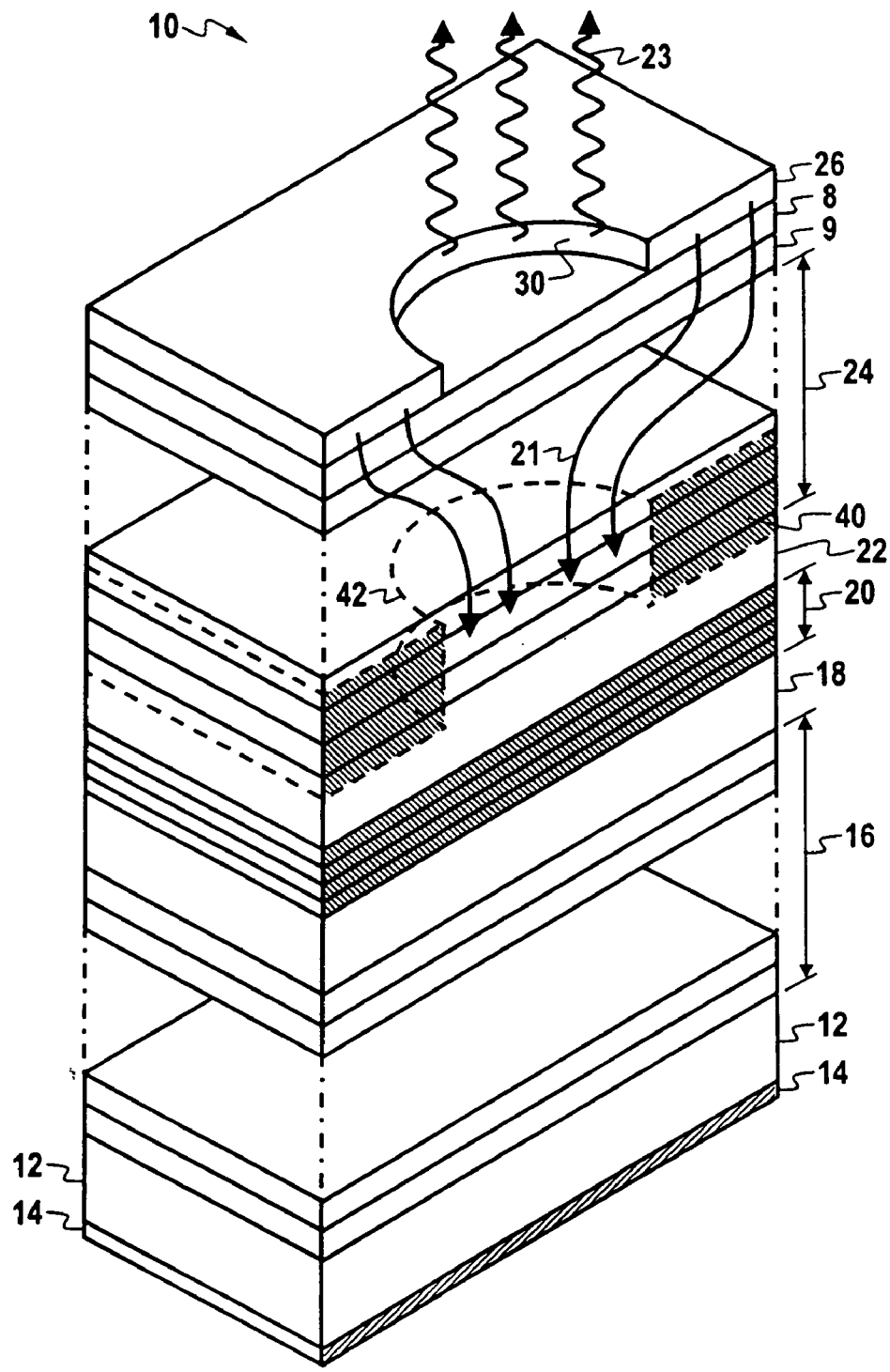
FIG. 1 illustrates a typical prior art VCSEL.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF EXEMPLARY EMBODIMENTS OF THE INVENTION

Reference will now be made in detail to embodiments of the present invention, examples of which are illustrated in the accompanying drawings.

Figure 2:
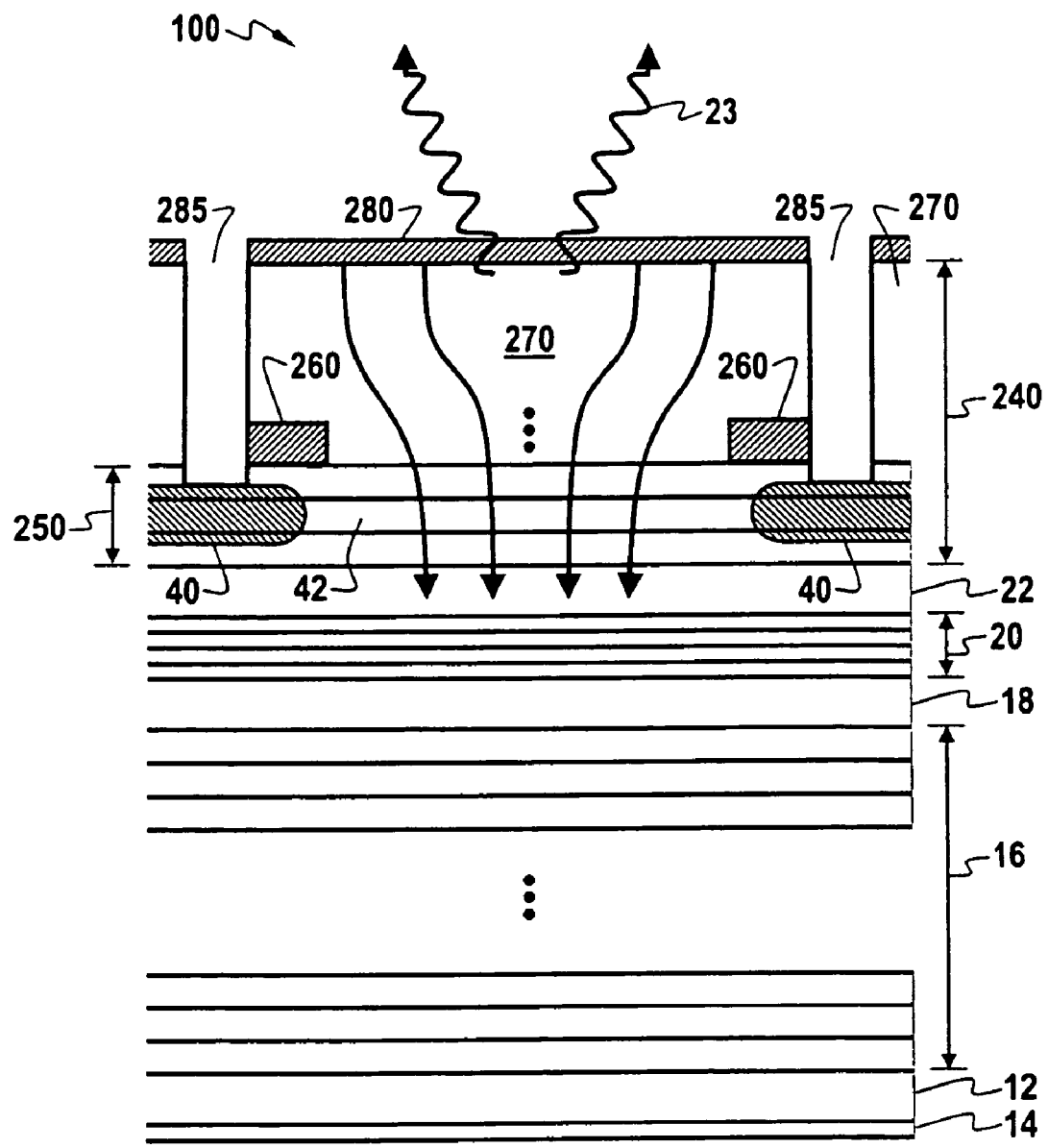
FIG. 2 illustrates a VCSEL that is in accord with the principles of the present invention.

The principles of the present invention provide for novel VCSELs that are well suited for use at long-wavelengths. Such VCSELs include a hybrid upper mirror structure comprised of a thin semiconductive top DBR and of an additional top mirror. An embodiment of a VCSEL 100 that is in accord with the principles of the present invention is illustrated in FIG. 2. FIG. 2 should be understood as a simplified "cut-away" schematic depiction of a VCSEL that is generally similar to the VCSEL 10 of FIG. 1. However, the VCSEL 100 includes novel features that render it particularly suitable for long wavelength applications.

As shown in FIG. 2, the VCSEL 100 includes an n-doped substrate 12 having an electrical contact 14. Suitable substrate materials include GaAs, InP, and InAs/GaSb. A suitable semiconductive epitaxy layer is grown on the substrate 12. Then, an n-doped lower mirror stack 16 (a DBR) is formed over the substrate 12, while an n-doped lower spacer 18 is formed on the lower mirror stack 16.

Still referring to FIG. 2, over the lower mirror stack 16 and n-doped lower spacer 18 is an active region 20 having P-N junction structures that sandwich a plurality of quantum wells. A p-doped top spacer 22 is over the active region 20.

Over the p-doped top spacer 22 is a special p-doped upper mirror structure 240. That upper mirror structure 240 includes a thin top DBR 250, metal contacts 260, a spreading layer 270, and a top mirror 280. The top DBR 250 can be of two basic types: one based on an oxide layer and the other based on implantation damage. In either case the top DBR includes an insulating region 40 having a central current aperture 42.

Figure 3:
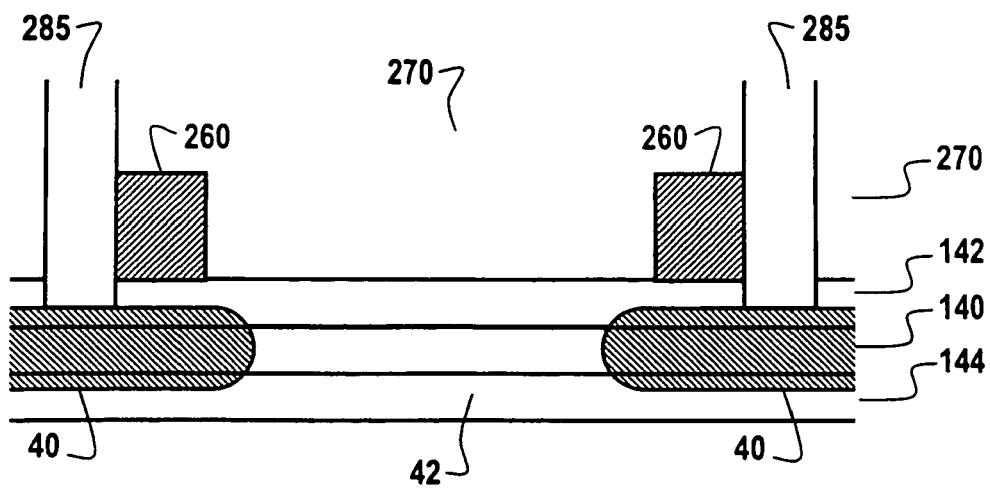
FIG. 3 schematically illustrates part of an upper mirror structure, specifically including a top DBR, that is in accord with the principles of the present invention.

FIG. 3 illustrates an oxide-type top DBR in more detail. That top DBR includes a layer stack having an oxide-seed layer 140 with a high Al content (over 95%, and beneficially greater than 98%). The oxide-seed layer 140 is disposed between a first layer 142 and a second layer 144. Both of those layers have lower Al content (generally around 85%) to prevent excessive thickness of the insulation region 40. Over the first layer 142 are the metal contacts 260 and the spreading layer 270. The spreading layer 270 and the first layer 142 are sufficiently thick that adequate current spreading of current applied via the metal contacts 260 occurs. However, the semiconductor layers of the top DBR 250 are no more than 3.5 microns thick. This prevents fabrication difficulties by reducing the depth of a trench 285 that is etched through the upper mirror structure 240 to the oxide-seed layer 140. Oxidation of the high Al content layer forms the insulation region 40 with its central aperture 42. As required, additional trenches can be formed through the top mirror structure 240 and into the active layer 20 (reference FIG. 2) so as to isolate individual VCSEL elements that may be fabricated on the same substrate.

Figure 4:
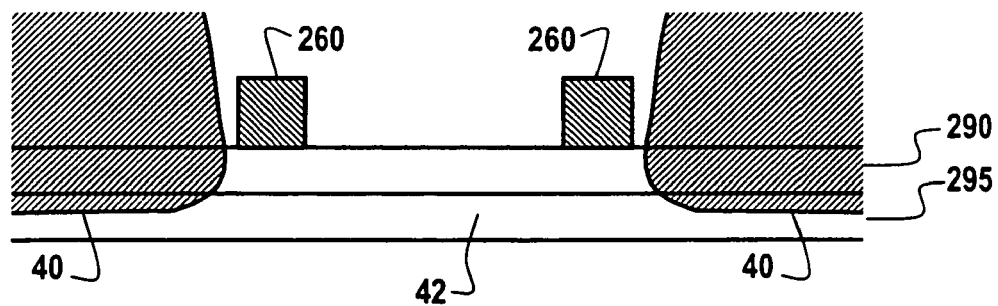
FIG. 4 schematically illustrates part of another upper mirror structure, specifically including a top DBR, that is in accord with the principles of the present invention.

FIG. 4 schematically illustrates an ion-implanted top DBR in more detail. That top DBR includes a thin layer stack that forms a reflective mirror. The ion-implanted top DBR also includes multiple layers of a first semiconductive material 290, having first reflective index, and a second semiconductive material 295, having a second reflective index. Over the semiconductive layers are metal contacts 260. As required, a spreading layer 270 (see FIG. 3) is disposed between the semi conductive layers of the top DBR and the metal contacts 260, and between the metal contacts 260. Ions are then implanted into the top DBR to form the insulation region 40 with its central aperture 42. If required, ion implantation can occur such that the insulation region 40 extends through the top DBR and into, and possibly through, the active region 20. This enables isolation of individual VCSEL elements fabricated on the same substrate. The ion-implanted top DBR (possibly with a spreading layer 270) must be sufficiently thick that adequate current spreading of current applied via the metal contacts 260 occurs. However, the top DBR is no more than 3.5 microns thick. This prevents fabrication difficulties by reducing the depth of ion implantation.

VCSELs that are in accord with the principles of the present invention are beneficially fabricated using normal semiconductor fabrication techniques. The initial step is fabricating a semiconductor epitaxy on a GaAs or on an InP substrate using MOCVD and/or by MBE. The specific epitaxy is wavelength/device dependent. For 1310 nm emissions from a GaAs substrate, the epitaxy will be Al/GaAs and/or InGaAsN and/or InGaAsNSb. For 1550 nm emissions from an InP substrate, the epitaxy will be AlGaInAs and/or InGaAsP and/or AlGaAsSb and/or InP. For 1550 nm emissions from a GaAs substrate the epitaxy will be Al/GaAs and/or InGaAsNSb.

After the epitaxial technology is chosen, semiconductor epitaxial growth is undertaken. That semiconductor growth includes fabricating a lower DBR 16 (reference FIG. 2). For 1310 nm or 1550 nm emissions from a GaAs substrate, the lower DBR 16 is beneficially fabricated from alternating compositions of $Al_{(x)}Ga_{(1-x)}As$ that produce high and low reflective indexes. Alternatively, for 1550 nm emissions from an InP substrate, the lower DBR 16 is beneficially fabricated from InGaAsP and InP, AlGaInAs and InP, and/or varying compositions of AlGaAsSb. Beneficially, the compositional and doping grades between the alternating layers are tailored to improve electrical properties (such as series resistance).

Referring to FIG. 2, after the fabrication of the lower DBR 16, semiconductor growth continues with the fabrication of lower and upper spacers (confinement layers) 18 and 22, and the active region 20. Beneficially, the lower and upper spacers 18 and 22 are comprised of low-doped layers having compositional grades on both sides of the active region 20. Again, the lower and upper spacers 18 and 22 form a laser cavity at the desired lasing wavelength. Furthermore, the active region 20 is beneficially located at a peak of the optical field within that cavity. The active region 20 beneficially includes 3 to 9 quantum wells that are sandwiched between semiconductor barrier layers having higher band-gap energies.

After the lower and upper spacers 18 and 22 and the active region 20 are formed, semiconductor fabrication continues with the fabrication of the semiconductor layers that comprise the top DBR 250. If required, those top DBR semiconductor layers include a current spreading layer 270.

After the top DBR 250 is fabricated, post-growth device processing is performed. The processing includes the deposition of the top mirror 280. The following post-growth processing steps are not necessarily completed in the following order, some steps can be deleted if not required for the particular VCSEL being fabricated, and design changes may be necessary.

If an oxide insulation region 40 is being used, a trench 285 is etched to the oxide-seeding layer and lateral oxidation is performed. If required, the trench 285 is etched, or another trench is etched, so as to isolate individual VCSELs that are on the same substrate 12. If an ion implanted insulation region 40 is being used, an ion implanter implants ions to form a gain guide insulation region 40. Ion implantation can be performed as required to isolate individual VCSELs on the same substrate. It is to be noted that some applications may use both ion implantation and oxide insulation. In any event, the relatively thin top DBR 250 enables either an etch and/or low energy implantation.

Additional post-growth processing includes the formation of the metal contacts 260. Such metal contacts are beneficially fabricated using sputtering or e-beams. Then, a top mirror 280, which enhances reflectivity, is fabricated. The top mirror is beneficially comprised of $TiO_2$, $TiO_2+SiO_2$ (robust and reliable), $TiO_2+Al_2O_3$ (good thermal conductivity), $Si+Al_2O_3$, or $Si+MgO$, or $Si_3N_4+SiO_2$. Alternatively, a metal can be used.

After the top mirror is fabricated, the devices on the semiconductor wafer can be characterized and diced out.

It should be noted that the thin top DBR typically does not provide sufficient reflectivity for normal lasing operation. Thus, the top mirror 280 is added to enhance reflectivity. Furthermore, it should be understood that electrical contacts are made to the metal contacts 260 such that current can be applied to the active region.

The embodiments and examples set forth herein are presented to explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. In a vertical cavity surface emitting laser, an upper mirror structure comprising:
    a metal contact;
    a top mirror above the metal contact; and
    a semiconductive top DBR having an insulation region, wherein the top DBR is no more than 3.5 microns thick and is disposed below the metal contact.

2. The upper mirror structure as recited in claim 1, further comprising a spreading layer located proximate the metal contact and the top mirror.

3. The upper mirror structure as recited in claim 1, wherein the top mirror comprises a dielectric material.

4. The upper mirror structure as recited in claim 3, wherein the dielectric material substantially comprises a material selected from a group that includes: $TiO_2$, $TiO_2+SiO_2$, $TiO_2+Al_2O_3$, $Si+MgO$, and $Si_3N_4+SiO_2$.

5. The upper mirror structure as recited in claim 1, wherein the top mirror comprises metal.

6. The upper mirror structure as recited in claim 1, wherein the semiconductive top DBR comprises:
    a first layer;
    a second layer located below the first layer; and
    an oxide seed layer, disposed between the first layer and the second layer, and wherein the insulation region is at least partially formed by oxidation of the oxide seed layer.

7. The upper mirror structure as recited in claim 6, wherein the upper mirror structure defines at least one trench extending into the upper mirror structure at least down to the insulation region.

8. The upper mirror structure as recited in claim 6, wherein the upper mirror structure defines at least one trench extending completely through the upper mirror structure.

9. The upper mirror structure as recited in claim 6, wherein the first and second layers have an Al composition lower than an Al composition of the oxide seed layer.

10. The upper mirror structure as recited in claim 6, wherein the oxide seed layer has an Al composition greater than 95%.

11. The upper mirror structure as recited in claim 6, wherein the first and second layers have an Al content of about 85%.

12. The upper mirror structure as recited in claim 1, wherein the semiconductive top DBR comprises:
    a first semiconductive material having a first reflective index; and
    a second semiconductive material having a second reflective index, the insulation region being at least partially formed by ion implantation of the first and second semiconductive layers.

13. The upper mirror structure as recited in claim 12, further comprising a spreading layer disposed between the metal contact and the top mirror, wherein the insulation region extends into the spreading layer.

14. A vertical cavity surface emitting laser, comprising:
    a substrate having a bottom contact;
    an active region over the substrate;
    a lower mirror layer disposed between the active region and the substrate; and
    an upper mirror structure located above the active region and comprising:
        a metal contact;
        a top mirror above the metal contact; and
        a semiconductive top DBR having an insulation region, wherein the semiconductive top DBR is no more than 3.5 microns thick and is disposed below the metal contact.

15. The vertical cavity surface emitting laser as recited in claim 14, wherein the active region is capable of emitting light at a predetermined wavelength in response to an applied electric current.

16. The vertical cavity surface emitting laser as recited in claim 15, wherein the predetermined wavelength is greater than 1300 nm.

17. The vertical cavity surface emitting laser as recited in claim 15, wherein the predetermined wavelength is greater than 1500 nm.

18. The vertical cavity surface emitting laser as recited in claim 15, wherein the lower mirror layer is a distributed Bragg reflector mirror.

19. The vertical cavity surface emitting laser as recited in claim 14, wherein the upper mirror structure further comprises a spreading layer located proximate the metal contact and the top mirror.

20. The vertical cavity surface emitting laser as recited in claim 14, wherein the top DBR comprises:
    a first layer;
    a second layer, below the first layer; and an oxide seed layer, disposed between the first layer and the second layer, and wherein the insulation region is at least partially formed by oxidation of the oxide seed layer.

21. The vertical cavity surface emitting laser as recited in claim 20, wherein the upper mirror structure defines at least one trench extending into the upper mirror structure at least down to the insulation region.

22. The vertical cavity surface emitting laser as recited in claim 20, wherein the upper mirror structure defines at least one trench extending completely through the upper mirror structure and into the active region.

23. The vertical cavity surface emitting laser as recited in claim 20, wherein the first and second layers have an Al composition lower than an Al composition of the oxide seed layer.

24. The vertical cavity surface emitting laser as recited in claim 20, wherein the oxide seed layer has an Al composition greater than 95%.

25. The vertical cavity surface emitting laser as recited in claim 20, wherein the first and second layers have an Al content of about 85%.

26. The vertical cavity surface emitting laser as recited in claim 14, wherein the top DBR comprises:
 a first semiconductive material having a first reflective index; and
 a second semiconductive material having a second reflective index, and wherein the insulation region is at least partially formed by ion implantation of the first and second semiconductive layers.

27. The vertical cavity surface emitting laser as recited in claim 26, further comprising a spreading layer located proximate the metal contact and the top mirror wherein the insulation region extends into the spreading layer.

* * * * *

UNITED STATES PATENT AND TRADEMARK OFFICE
CERTIFICATE OF CORRECTION

PATENT NO.       : 7,110,427 B2
APPLICATION NO.  : 10/933876
DATED            : September 19, 2006
INVENTOR(S)      : Johnson et al.

It is certified that error appears in the above-identified patent and that said Letters Patent is hereby corrected as shown below:

Drawings
Sheet 3, replace Figure 3 with the figure depicted herein below wherein the top mirror has been labeled --280-- and the spreading layer has been labeled --270--

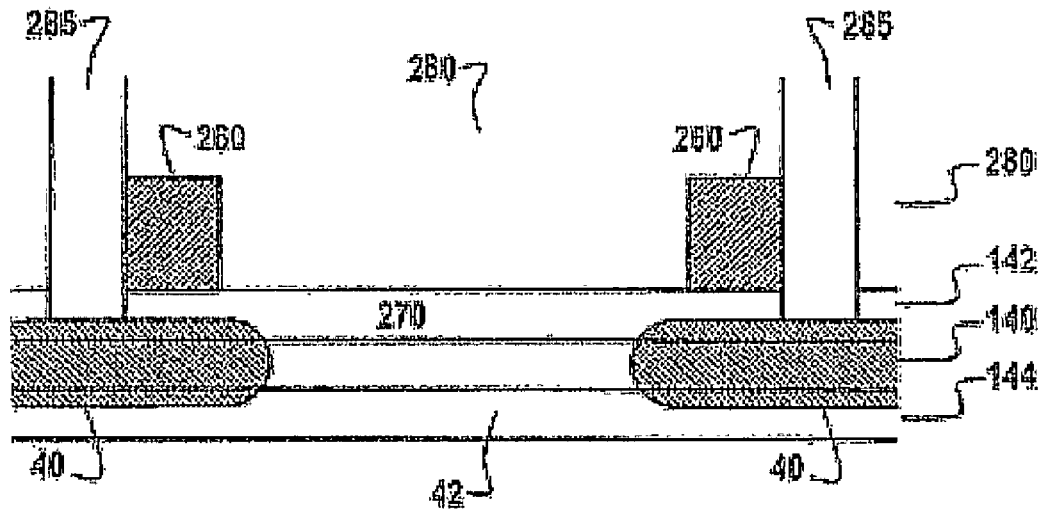

Figure 3

UNITED STATES PATENT AND TRADEMARK OFFICE
CERTIFICATE OF CORRECTION

PATENT NO.        : 7,110,427 B2                                              Page 2 of 3
APPLICATION NO. : 10/933876
DATED             : September 19, 2006
INVENTOR(S)       : Johnson et al.

It is certified that error appears in the above-identified patent and that said Letters Patent is hereby corrected as shown below:

Drawings
Sheet 2, replace Figure 2 with the figure depicted herein below, wherein the top mirror has been labeled --280-- and the spreading layer has been labeled --270--

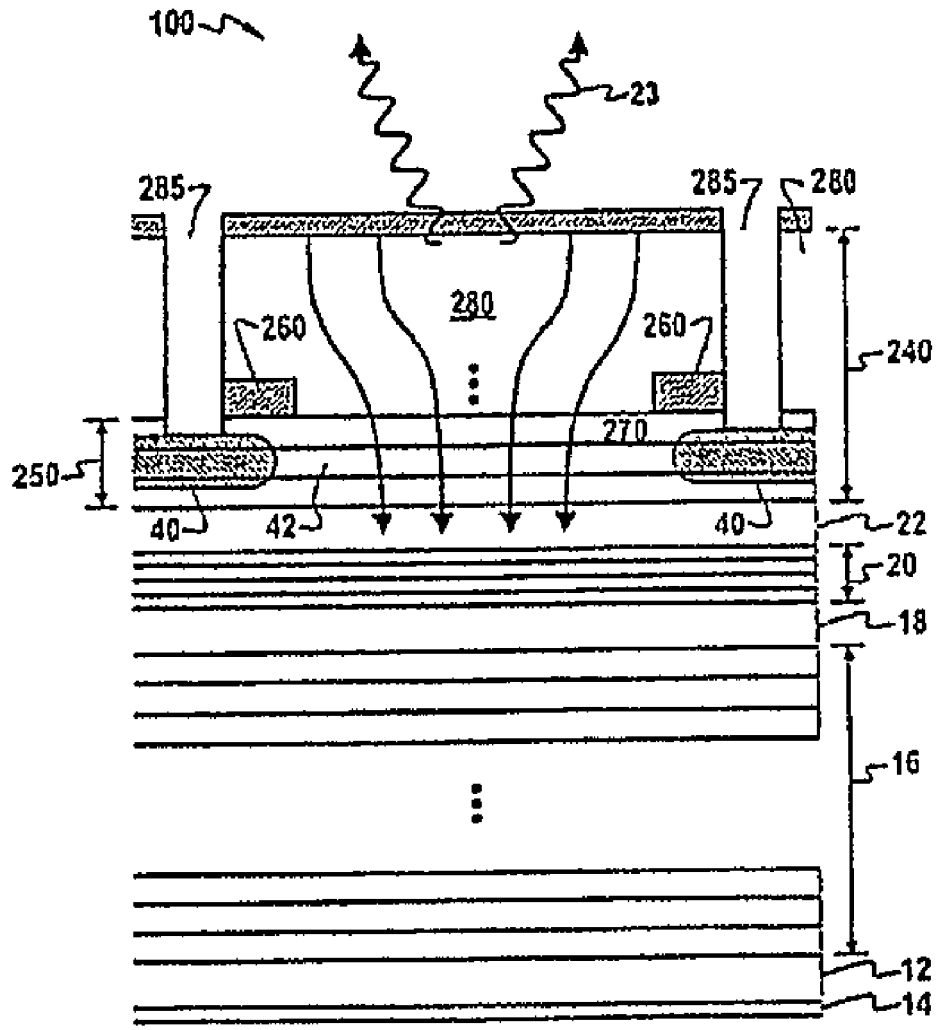

Figure 2

UNITED STATES PATENT AND TRADEMARK OFFICE
CERTIFICATE OF CORRECTION

PATENT NO. : 7,110,427 B2
APPLICATION NO. : 10/933876
DATED : September 19, 2006
INVENTOR(S) : Johnson et al.

It is certified that error appears in the above-identified patent and that said Letters Patent is hereby corrected as shown below:

Column 6
Line 30, change "$Ga_{31\,x}$" to --$Ga_{1-x}$--

Signed and Sealed this

Fourth Day of September, 2007

JON W. DUDAS
*Director of the United States Patent and Trademark Office*